United States Patent [19]
Huang et al.

[11] Patent Number: 6,015,734
[45] Date of Patent: Jan. 18, 2000

[54] METHOD FOR IMPROVING THE YIELD ON DYNAMIC RANDOM ACCESS MEMORY (DRAM) WITH CYLINDRICAL CAPACITOR STRUCTURES

[75] Inventors: Kuo Ching Huang, Kaohsiung; Yu Hua Lee, Hsinchu; Cheng-Ming Wu, Kao-Hsiung, all of Taiwan

[73] Assignee: Taiwan Semiconductor Manufacturing Company, Ltd., Hsin-Chu, Taiwan

[21] Appl. No.: 09/148,561

[22] Filed: Sep. 4, 1998

[51] Int. Cl.$^7$ .................................. H01L 21/8242
[52] U.S. Cl. .............................. 438/253; 438/254
[58] Field of Search ................... 438/253–256, 438/390–398

[56] References Cited

U.S. PATENT DOCUMENTS

| | | | |
|---|---|---|---|
| 5,332,685 | 7/1994 | Park et al. | 437/52 |
| 5,430,614 | 7/1995 | Ahn . | |
| 5,550,078 | 8/1996 | Sung | 437/52 |
| 5,681,773 | 10/1997 | Tseng | 437/52 |
| 5,688,713 | 11/1997 | Linliu et al. . | |
| 5,710,075 | 1/1998 | Tseng | 438/254 |
| 5,716,883 | 2/1998 | Tseng | 438/253 |
| 5,728,618 | 3/1998 | Tseng | 437/253 |
| 5,736,450 | 4/1998 | Huang et al. | 438/396 |
| 5,753,547 | 5/1998 | Ying | 438/253 |
| 5,759,892 | 6/1998 | Wang et al. | 438/254 |

Primary Examiner—Jey Tsai
Attorney, Agent, or Firm—George O. Saile; Stephen B. Ackerman

[57] ABSTRACT

A new method for forming stacked capacitors for DRAMs having improved yields when the bottom electrode is misaligned to the node contact is achieved. A planar silicon oxide ($SiO_2$) first insulating layer, a $Si_3N_4$ etch-stop layer, and a disposable second insulating layer are deposited. First openings for node contacts are etched in the insulating layers. A polysilicon layer is deposited and etched back to form node contacts in the first openings. The node contacts are recessed in the second insulating layer, but above the etch-stop layer to form node contacts abutting the etch-stop layer. A disposable third $SiO_2$ layer is deposited. Second openings for bottom electrodes are etched over and to the node contacts. A conformal second polysilicon layer is deposited and chem/mech polished back to form the bottom electrodes in the second openings. The third and second insulating layers are removed by wet etching to the etch-stop layer. When the second openings are misaligned over the node contact openings, the polysilicon plugs abutting the $Si_3N_4$ etch-stop layer protect the $SiO_2$ first insulating layer from being eroded over the devices on the substrate. The capacitors are completed by forming a thin dielectric layer on the bottom electrodes, and forming top electrodes from a patterned third polysilicon layer.

20 Claims, 6 Drawing Sheets

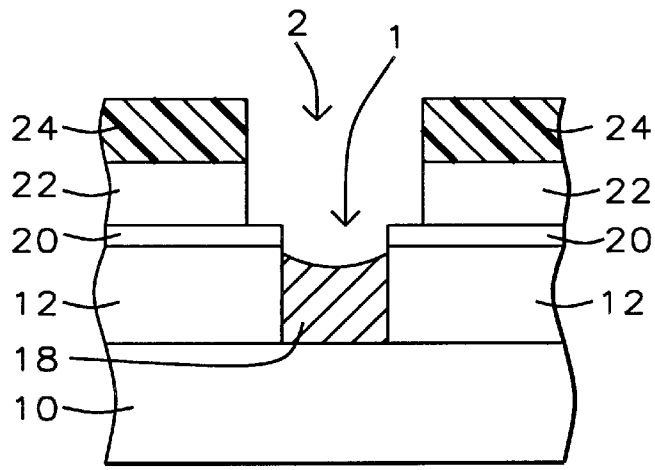
FIG. 1A – Prior Art
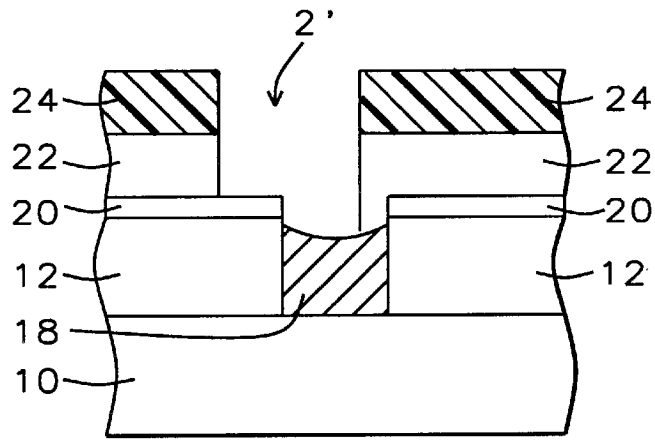
FIG. 1B – Prior Art
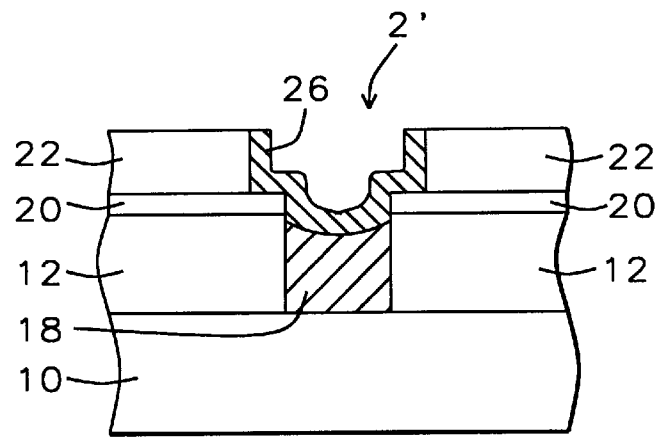
FIG. 2A – Prior Art

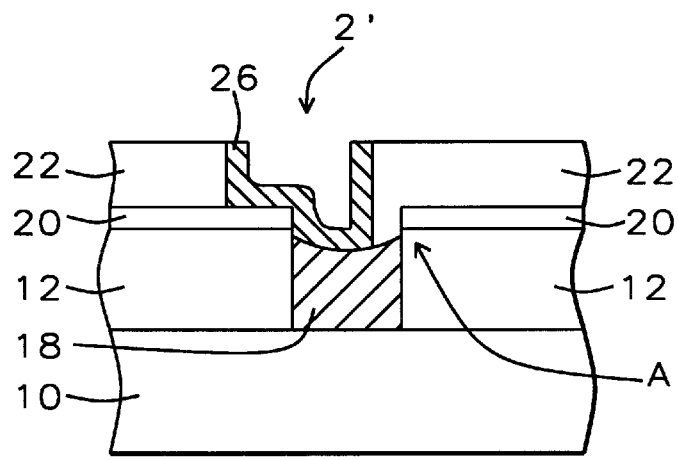
FIG. 2B – Prior Art
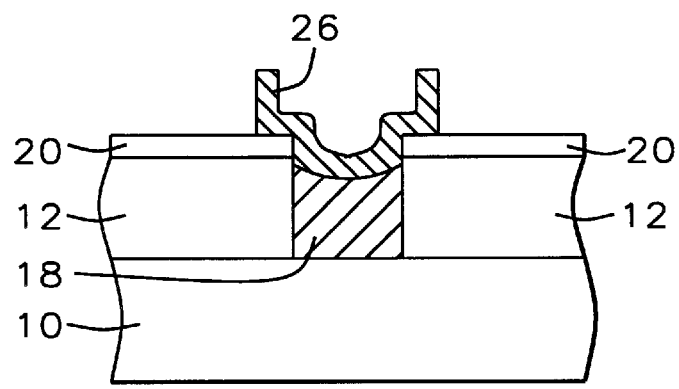
FIG. 3A – Prior Art
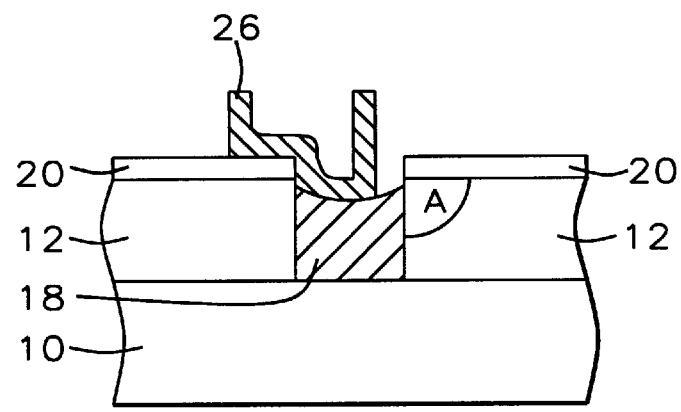
FIG. 3B – Prior Art

METHOD FOR IMPROVING THE YIELD ON DYNAMIC RANDOM ACCESS MEMORY (DRAM) WITH CYLINDRICAL CAPACITOR STRUCTURES

BACKGROUND OF THE INVENTION

(1) FIELD OF THE INVENTION

The present invention relates to the fabrication of dynamic random access memory (DRAM) devices, and more particularly to a method for fabricating stacked storage capacitors for DRAM cells using an improved semiconductor process. Openings in a disposable insulating layer are used as a template for making capacitor bottom electrodes. When these openings are misaligned to the underlying polysilicon node contacts, this process eliminates erosion of an underlying insulating layer over the devices on the substrate.

(2) DESCRIPTION OF THE PRIOR ART

Ultra Large Scale Integration (ULSI) technologies have dramatically increased the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the chip.

One conventional method of achieving a high density of memory cells on a DRAM chip is to form a capacitor node contact to one of the source/drain areas of the FET in each of the memory cells, and then to form a bottom electrode aligned over the node contact. In the next generation of semiconductor technology, the minimum feature sizes will be 0.25 micrometers (um) or less. At these feature sizes, misalignment of the bottom electrode to the node contact can result in processing and reliability problems. One of these problems is best illustrated in the prior art depicted in FIGS. 1A through 3B. FIG. 1A shows a typical memory cell area on a substrate 10 having a silicon oxide ($SiO_2$) first insulating layer 12 and a silicon nitride ($Si_3N_4$) etch-stop layer 20. A patterned photoresist mask (not shown) and plasma etching are used to etch first openings 1 in layers 12 and 20 for node contacts. A doped first polysilicon layer is deposited and etched back to form the capacitor node contacts 18 (plugs) in openings 1. Because of variations in etch-rate uniformities across the substrate, and because of nonuniformity in the polysilicon deposition, it is necessary to overetch for forming the polysilicon plugs for the node contacts to ensure that all the polysilicon is removed from the surface of the etch-stop layer 20. This results in recessed polysilicon plugs that expose the sidewalls of the first insulating layer 12. A disposable second insulating layer 22 is deposited, and a second photoresist mask 24 and plasma etching are used to etch second openings 2 in layer 22 for forming the capacitor bottom electrode, as shown in FIG. 1A. However, because of the difficulty of aligning the images for high-density circuits, the photoresist 24 for making the second opening 2' can be misaligned to the node contact 18, as shown in FIG. 1B.

Referring to FIGS. 2A and 2B, a conformal second polysilicon layer 26 is deposited and polished back to form the capacitor bottom electrode 26. As shown in FIG. 2B for the misaligned opening 2', the disposable second insulating layer 22 is adjacent to and in contact with the first insulating layer 12 at point A.

Now, as shown in FIG. 3A, the disposable $SiO_2$ second insulating layer 22 is removed using a wet etch, such as a hydrofluoric acid solution. The $Si_3N_4$ etch-stop layer 20 prevents the etchant from attacking the first insulating layer 12 over the devices on the substrate 10. However, as shown in FIG. 2B for the misaligned opening 2' for the bottom electrode, when the second insulating layer 22 is etched, the first insulating layer 12 is also etched or eroded away at the point A, shown in FIG. 3B, which can cause electrical shorts and other reliability problems. Therefore, it is desirable to modify the conventional method to prevent this oxide erosion problem.

There are numerous methods of making DRAM circuits with stacked capacitors that are reported in the literature. Several methods for making DRAM capacitors are cited below, but do not address this misalignment problem. Wang et al. in U.S. Pat. No. 5,759,892 utilize polysilicon sidewall spacers to protect the insulating layer over the devices when the capacitor bottom electrode is misaligned to the polysilicon node contacts. Tseng in U. S. Pat. No. 5,728,618 and Ying in U. S. Pat. No. 5,753,547 teach a method for making capacitor bottom electrodes over node contacts. However, the first insulating layer can be eroded if the opening for the bottom electrode is misaligned over the node contact. In U.S. Pat. No. 5,681,773 to Tseng, the first insulating layer can be eroded when the bottom electrode is misaligned to the node contact and when the node contact is recessed below etch-stop layer. Park et al. in U. S. Pat. No. 5,332,685 teach a method for making DRAM cells with node contacts that have reduced aspect ratio for improved processing, and bit lines adjacent to the capacitors. Sung in U. S. Pat. No. 5,550,078 shows another method for making capacitors adjacent to bit lines. Huang et al. in U. S. Pat. No. 5,736,450 teach a method for forming a cylindrical capacitor but do not address the misalignment problem. Tseng in U. S. Pat. No. 5,716,883 teaches a method for making a capacitor using insulating sidewall spacers as an etch mask, but does not address the misalignment problem associated with the more conventional process. Tseng in U. S. Pat. No. 5,710,075 teaches a method for making cylindrical-walled capacitors, but does not address the misalignment problem.

Therefore, there is still a need to improve upon the conventional process for fabricating reliable DRAM capacitors when the capacitor bottom electrode is misaligned to the node contact.

SUMMARY OF THE INVENTION

It is a principal object of the present invention to provide a method for making memory cells on DRAM devices with improved cylinder-shaped stacked capacitors having increased capacitance.

It is another object of this invention to provide a method using a disposable insulating layer over an etch-stop layer in which contact openings are formed for recessed polysilicon node contacts. The node contacts extend above and abut the side of the etch-stop layer. This allows the openings for the capacitor bottom electrodes to be misaligned over the node contacts without causing erosion when the disposable insulating layer is removed. This provides a larger latitude in misalignment for high-density DRAM circuits.

Still another object of this invention is to provide a method that does not require additional processing steps over the conventional method, which provides a cost-effective manufacturing process.

The invention begins by providing a semiconductor substrate (wafer) composed of single-crystalline silicon. The semiconductor devices in the substrate are not explicitly described in detail since they are not essential to understanding the invention. But typically the memory cells on a substrate for DRAM circuits have device areas surrounded and electrically isolated by field oxide (FOX) regions, and semiconductor devices such as field effect transistors (FETs) in the device areas. A cylinder-shaped storage capacitor is then formed over each of the memory cell areas to one of the device contact areas using a polysilicon plug as the capacitor node contact.

Continuing with the process, the method is described for making these improved cylinder-shaped capacitors using this modified method to avoid silicon oxide ($SiO_2$) erosion when misalignment of the capacitor to the polysilicon plug (node contact) occurs. A first insulating layer is deposited on the substrate, which is then planarized. The first insulating layer is $SiO_2$ or a doped oxide such as a borophosphosilicate glass (BPSG). An etch-stop layer, preferably composed of silicon nitride ($Si_3N_4$), is deposited on the first insulating layer. A disposable second insulating layer is deposited on the etch-stop layer. First openings are etched for capacitor node contacts in the second insulating layer, the etch-stop layer, and the first insulating layer to the device areas. A conductively doped first polysilicon layer is deposited to a thickness sufficient to fill the first openings, and is etched back to form polysilicon plugs in the first openings. A key feature of this invention is that the polysilicon plugs are recessed below the top surface of the second insulating layer and above the etch-stop layer. This results in the polysilicon plugs being abutted to the sidewalls of the etch-stop layer in the first openings. And at a later processing step, the polysilicon plugs abutting the etch-stop layer prevent erosion of the first insulating layer over the devices when misalignment occurs during the formation of the capacitor bottom electrode.

A third insulating layer is deposited on the substrate, and the total thickness of the third and second insulating layers determines the height of the bottom electrodes. Second openings, that are wider than the first openings, are etched in the disposable third and second insulating layers to the etch-stop layer, and over and to the polysilicon plugs. Next, a conformal second polysilicon layer is deposited over and in the second openings and is polished back to form bottom electrodes in the second openings. Unfortunately, because of the more critical design rules for deep submicron ULSI devices (about 0.18 um), the alignment of the photoresist mask for the second openings can be misaligned to the first openings.

The disposable third and second insulating layers are then isotropically and selectively etched to the etch-stop layer to leave free-standing bottom electrodes. When the second openings are misaligned to the first openings, the polysilicon plugs abutting the sidewalls of the etch-stop layer, protect the $SiO_2$ first insulating layer from etching when the disposable third and second insulating layers are removed. The DRAM capacitors are now completed by depositing an interelectrode dielectric layer on the bottom electrodes, and then depositing and patterning a third polysilicon layer to form top electrodes for the cylinder-shaped capacitors.

BRIEF DESCRIPTION OF THE DRAWINGS

The objects and other advantages of this invention are best understood in the preferred embodiment with reference to the attached drawings, which are now briefly described.

FIGS. 1A, 1B, 2A, 2B, 3A, 3B are schematic cross-sectional views showing the sequence of process steps that result in oxide erosion on conventional DRAM capacitors when misalignment occurs.

DESCRIPTION OF THE PREFERRED EMBODIMENT

Figure 4:
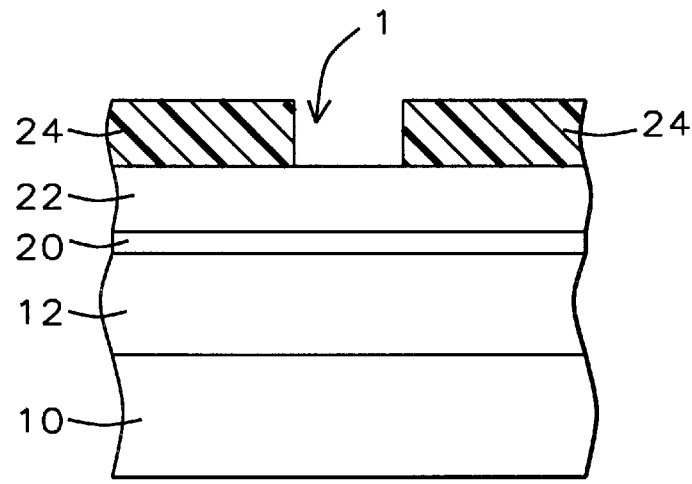
FIGS. 4 to 8, 9A–9B, 10A–10B and 11A–11B are schematic cross-sectional views showing the sequence of process steps for making a modified DRAM capacitor by the method of this invention, which eliminates the oxide erosion problem.

Now in keeping with the objects of the present invention, the method for forming the cylinder-shaped storage capacitors is described in detail. These improved capacitors can be made on DRAM circuits having FET structures that are currently utilized in the manufacture of DRAMs. The details for the semiconductor devices in and on the substrate are not explicitly depicted in the drawings and are not described in detail since they are fabricated as commonly practiced in the industry and are not essential for understanding the invention. The underlying DRAM structure on the substrate is only briefly described to put the current invention in perspective. Typically each of the DRAM cells includes a single pass transistor, such as an N-channel field effect transistor (FET) having two source/drain contact areas. The stacked capacitor is formed to one of the source/drain contact areas, commonly referred to as the capacitor node contact, while the other source/drain contact area is connected to a bit line. Also, it should be well understood by those skilled in the art that by including additional processing steps, other types of devices can be included on the DRAM chip. For example, by providing N and P doped wells, both P-channel and N-channel FETs can be formed for fabricating CMOS circuits, as are commonly used-in the peripheral circuits of the chip.

Referring now to FIG. 4 and more specifically, the method for making these stacked capacitors consists of providing a substrate 10 having a partially completed DRAM cell, as described above. The preferred substrate is composed of a P-type single-crystal silicon with a <100>crystallographic orientation. A storage capacitor is then formed over each of the memory cell areas to one of the FET source/drain contact areas using a polysilicon plug as the node contact.

Still referring to FIG. 4, the method for making the improved cylinder-shaped capacitors is now described. Only one of the array of capacitors is depicted in the drawings. A first insulating layer 12 is deposited on the substrate 10 to insulate the semiconductor devices (not shown) on the substrate. Layer 12 is preferably $SiO_2$, and is deposited by low-pressure chemical vapor deposition (LPCVD) using a reactant gas such as tetraethosiloxane (TEOS). Alternatively, layer 12 can be a borophospho-silicate glass (BPSG) deposited by LPCVD using TEOS, and is doped with boron and phosphorus during the silicon oxide deposition. The first insulating layer 12 is then planarized. For example, layer 12 can be planarized using chemical/mechanical polishing (CMP) to provide global planarization. Alternatively, if a BPSG is used, the layer can be leveled by thermal annealing. The thickness of layer 12 after planarizing is preferably between about 3000 and 6000 Angstroms over the underlying semiconductor devices on the substrate 10. An etch-stop layer 20 is deposited over the first insulating layer 12. Layer 20 is preferably composed of silicon nitride ($Si_3N_4$) and is deposited by LPCVD using, for example, a reactant gas mixture such as dichlorosilane ($SiCl_2H_2$) and ammonia ($NH_3$). The etch-stop layer 20 is deposited to a preferred thickness of between about 100 and 300 Angstroms. Next, a second insulating layer 22 is deposited over the etch-stop layer 20. Layer 22 is preferably $SiO_2$ and is deposited by LPCVD to a thickness of between about 2000 and 5000 Angstroms. Conventional photolithographic techniques are used to make a photoresist mask 24 for etching first contact openings 1 to one of the source/drain contact areas (not shown) for the capacitor node contacts.

Figure 5:
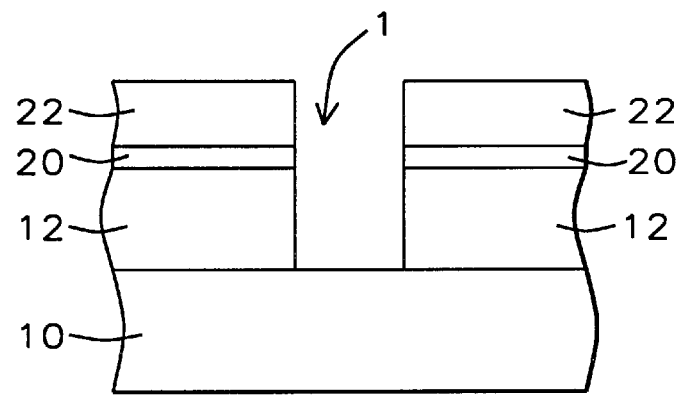

Referring to FIG. 5, first openings 1 are etched in the second insulating layer 22, in the etch-stop layer 20, and in the first insulating layer 12 to the substrate 10 for capacitor node contacts. Preferably the etching is an anisotropic plasma etching carried out in a high-density plasma (HDP) etcher using an etchant gas such as carbon tetrafluoride ($CF_4$), trifluoromethane ($CHF_3$), nitrogen ($N_2$) and a carrier gas of argon (Ar) having a high etch-rate selectivity of $SiO_2$ to silicon. After etching the first openings 1, the photoresist mask 24 (shown in FIG. 4) is removed, for example, by plasma ashing in oxygen ($O_2$).

Figure 6:
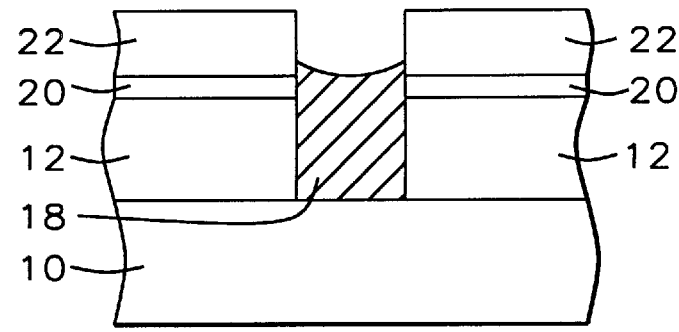

Referring to FIG. 6, a conformal first polysilicon layer 18 is deposited and is etched back to form polysilicon plugs 18 in the first openings 1. Layer 18 is preferably deposited by LPCVD using, for example, silane ($SiH_4$) as the reactant gas, and is in-situ doped with an N type dopant such as phosphorus to a concentration of between 1.0 E 19 and 1.0 E 21 atoms/cm$^3$ Layer 18 is deposited to a thickness sufficient to fill the first contact openings 1, and more specifically to a thickness of between about 2000 and 5000 Angstroms. The polysilicon layer 18 is then selectively etched back to the second insulating layer 22 to form recessed polysilicon plugs 18 in the first openings 1. The etching is preferably carried out using reactive ion etching (RIE) and an etchant gas containing chlorine. A key feature of the invention is that the second insulating layer 22 is sufficiently thick so that the top surface of the polysilicon plugs 18 can be recessed below the top surface of layer 22 but above the top surface of the etch-stop layer 20. This results in the polysilicon plugs 18 being abutted to the sidewalls of the etch-stop layer 20 in the first openings 1. And at a later processing step, the polysilicon plugs 18 abutting the etch-stop layer 20 prevent erosion of the first insulating layer 12 over the devices when misalignment occurs during the formation of the capacitor bottom electrode. The thickness of the second insulating layer 22 provides processing latitude when etching back to form the polysilicon plugs 18 when the etching is non-uniform across the wafer.

Figure 7:
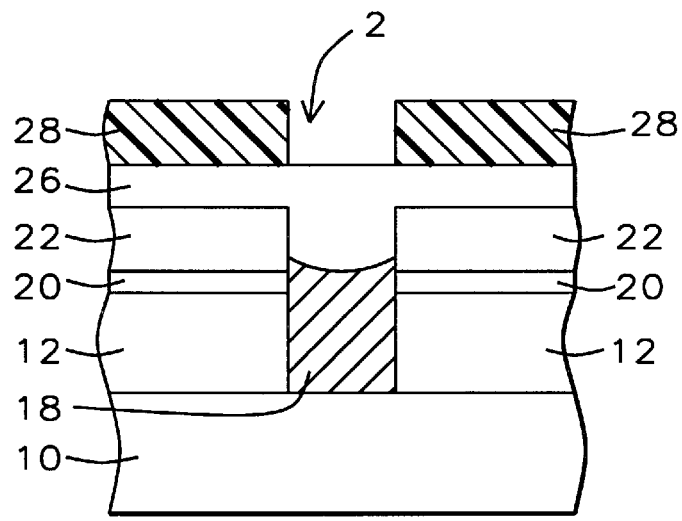

Referring now to FIG. 7, a third insulating layer 26, composed of $SiO_2$, is deposited by LPCVD using, for example, TEOS as the reactant gas. The thickness of layer 26 is determined so that the total thickness of the second and third insulating layers 22 and 26 are equal to the total thickness of a single oxide layer (for example, of the prior art) for defining the height of the capacitor bottom electrode. Typically the thickness of layer 26 is between about 1000 and 4000 Angstroms.

Still referring to FIG. 7, a photoresist mask 28 is patterned to etch openings 2 that are wider than and aligned over the first contact openings 1.

Figure 8:
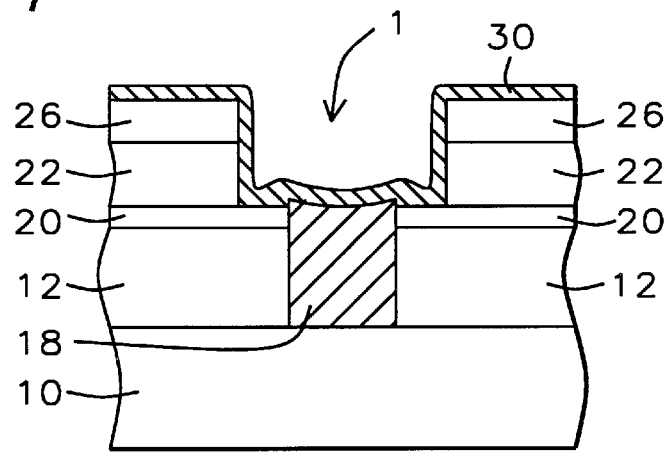

As shown now in FIG. 8, the second openings 2 for capacitor bottom electrodes are etched in the third and second insulating layers 26 and 22 over the polysilicon plugs 18. The second openings 2 are anisotropically and selectively plasma etched in layers 26 and 22 to the etch-stop layer 20, exposing the polysilicon plugs 18. The etching is preferably carried out using a high-density plasma (HDP) etcher and etches $SiO_2$ and $Si_3N_4$ selectively to the polysilicon plug 18. For example, the etching can be achieved using an etchant gas such as $CF_4/CHF_3/N_2$ and a carrier gas such as Ar.

Still referring to FIG. 8, the photoresist mask 28 (shown in FIG. 7) is removed, for example, by plasma ashing in oxygen. Then a conformal second polysilicon layer 30 is deposited for the capacitor bottom electrodes in the second openings 2. Preferably polysilicon layer 30 is deposited by LPCVD using, for example, $SiH_4$, and is in-situ doped with phosphorus to a concentration of between about 1.0 E 19 and 1.0 E 21 atoms/cm$^3$. Layer 30 is deposited to a thickness of between about 500 and 2000 Angstroms. The second polysilicon layer 30 electrically contacts the polysilicon plugs 18 (node contacts) that extend above the etch-stop layer 20.

Figure 9A:
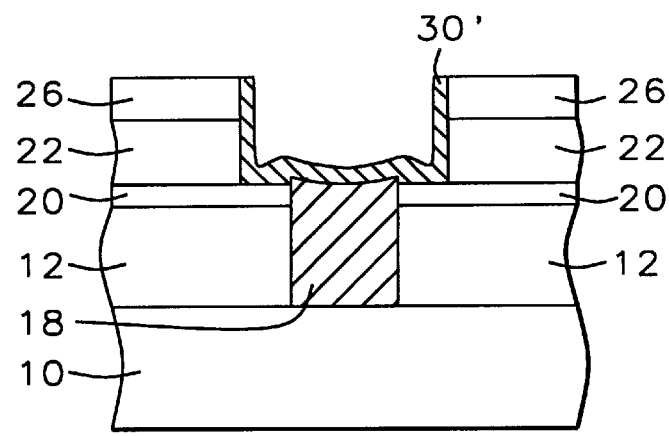
Figure 9B:
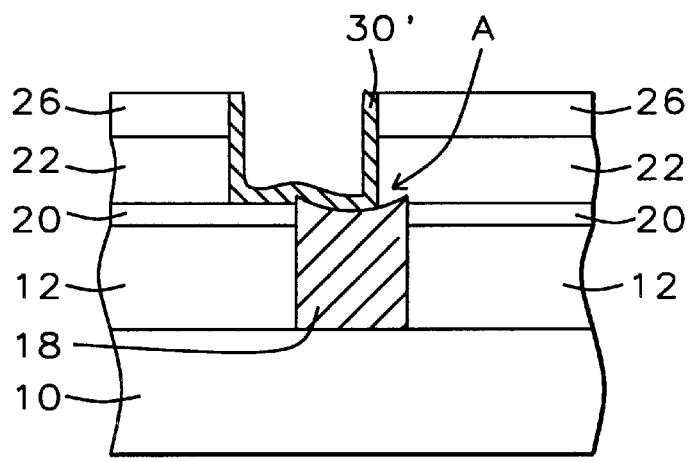

Referring to FIG. 9A, the second polysilicon layer 30 is polished back to the third insulating layer 26 to form bottom electrodes having a height that is equal to the total thickness of the third and second insulating layer (26 and 22) in the second openings 2. However, for high-density circuits having minimum feature sizes of about 0.18 um, misalignment of the second openings 2 to the first openings 1 can occur, as sown in FIG. 9B. By the method of this invention, the polysilicon plug 18, extending above and abutting the etch-stop layer 20, prevents erosion of the first insulating layer 12 over the devices on the substrate when the disposable third and second insulating layers 26 and 22 are removed.

Figure 10A:
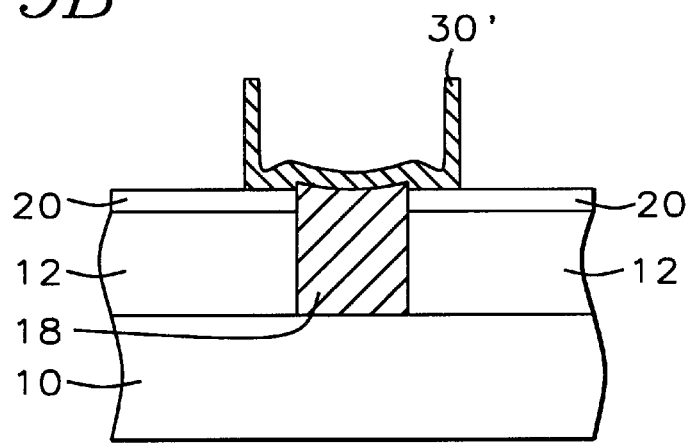
Figure 10B:
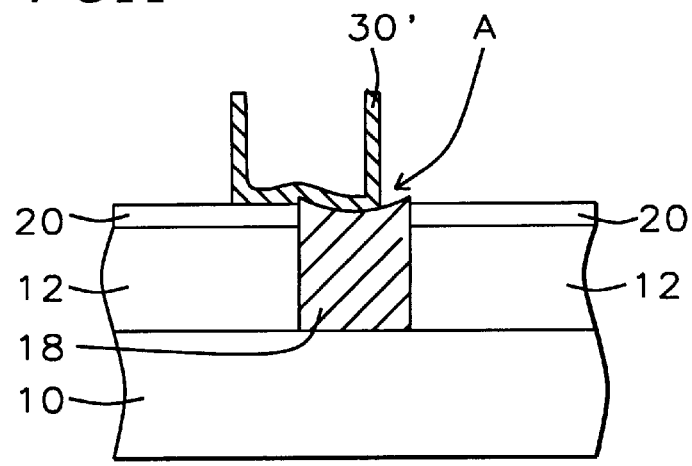

Referring to Fig. 10A, the disposable third and second insulating layers 26 and 22 are removed using an isotropic etch such as hydrofluoric (HF) acid solution to leave freestanding bottom electrodes 30'. As shown in Fig. 10B, when the bottom electrode is misaligned to the polysilicon plug 18, the plug 18 abutting the etch-stop layer 20 prevents the erosion or etching of the first insulating layer 12.

Figure 11A:
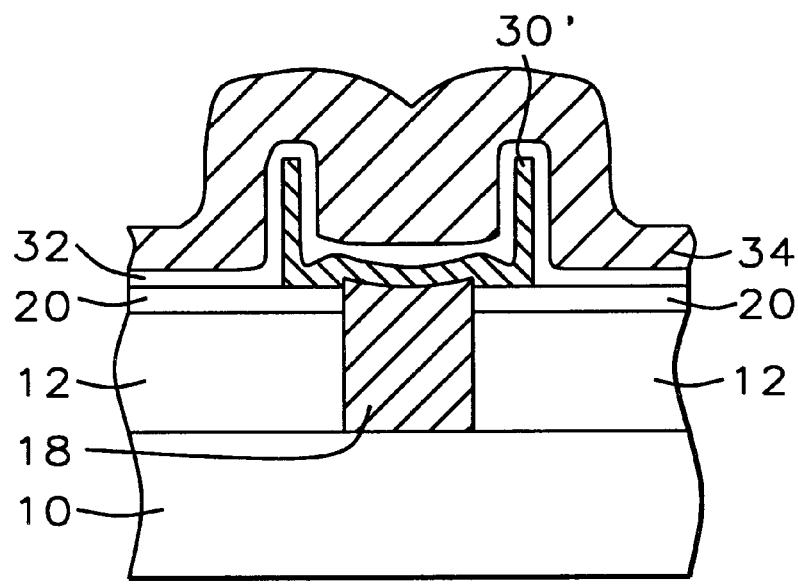
Figure 11B:
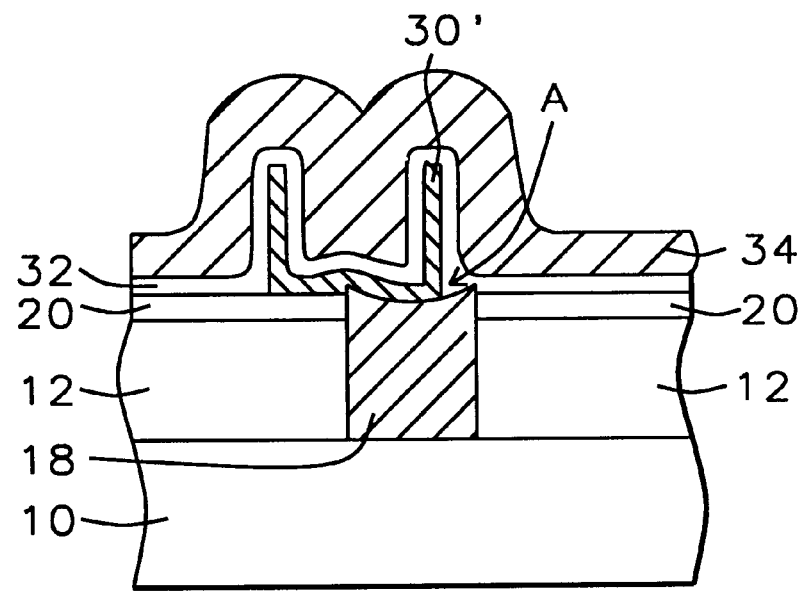

As shown in FIGS. 11A and 11B, the DRAM cylindrical capacitors are now completed by depositing an interelectrode dielectric layer 32 on the bottom electrodes 30', and forming the capacitor top electrodes by depositing and patterning a third polysilicon layer 34. The completed DRAM device is shown for an aligned capacitor/node structure in Fig. 11A, and for a misaligned structure in Fig. 11B. The interelectrode dielectric layer 32 is formed on the surface of the bottom electrodes. The dielectric layer 32 is preferably between about 40 and 100 Angstroms thick, and is composed of a material having a high dielectric constant that is compatible with the polysilicon processing, and is continuous and pin-hole free. The preferred interelectrode dielectric layer is composed of silicon oxide-silicon nitride (ON) or a silicon oxide-silicon nitride-silicon oxide (ONO) layer. For example, the surface of the polysilicon bottom electrode 30' can be thermally oxidized to form the $SiO_2$, and then a thin conformal $Si_3N_4$ layer can be deposited using LPCVD to form the ON layer. To form the ONO layer, the exposed surface of the $Si_3N_4$ layer can then be reduced in an oxidizing ambient at elevated temperatures. Additionally, the surface of the polysilicon bottom electrodes 30' can be roughened to further increase the surface area and the capacitance. Other high-dielectric constant insulators can also be used, such as tantalum pentoxide ($Ta_2O_5$) and the like. The third polysilicon layer 34 is deposited over the interelectrode dielectric layer 32, and is then patterned using conventional photolithographic and plasma etching techniques to form the top electrodes 34. The third polysilicon layer 34 is preferably deposited by LPCVD to a thickness of between about 500 and 2000 Angstroms, and is in-situ doped with an N-type dopant, such as phosphorous (P), having a preferred concentration in the range of between about 1.0 E 19 to 1.0 E 21 atoms/cm$^3$.

While the invention has been particularly shown and described with reference to the preferred embodiment thereof, it will be understood by those skilled in the art that various changes in form and detail may be made without departing from the spirit and scope of the invention.

What is claimed is:

1. A method for fabricating stacked capacitors for memory devices comprising the steps of:

providing a semiconductor substrate having device areas with semiconductor devices;

forming a planar first insulating layer over said device areas on said substrate;

depositing a blanket etch-stop layer on said first insulating layer;

depositing a second insulating layer on said etch-stop layer;

selectively etching first openings for capacitor node contacts in said second insulating layer, said etch-stop layer, and said first insulating layer to said device areas;

depositing a conductively doped first polysilicon layer to fill said first openings, and etching back said first polysilicon layer to form polysilicon plugs that are recessed below the surface of said second insulating layer and above said etch-stop layer;

depositing a third insulating layer;

selectively etching second openings, over and wider than said first openings, in said third and said second insulating layers to the top surface of said etch-stop layer and to said polysilicon plugs;

depositing a conformal second polysilicon layer over and in said second openings and contacting said polysilicon plugs;

polishing back said second polysilicon layer to said third insulating layer to form bottom electrodes in said second openings;

isotropically etching said third and said second insulating layers selectively to said etch-stop layer to leave freestanding said bottom electrodes, while said polysilicon plugs that abut said etch-stop layer prevent said etching from eroding said first insulating layer when said second openings are misaligned to said first openings;

depositing an interelectrode dielectric layer on said bottom electrodes;

depositing and patterning a third polysilicon layer to form top electrodes and completing said stacked capacitors.

2. The method of claim 1, wherein said first insulating layer is silicon oxide, and has a thickness of between about 3000 and 6000 Angstroms after planarizing.

3. The method of claim 1, wherein said first polysilicon layer is doped with conductive impurities to a concentration of between about 1.0 E 17 and 1.0 E 21 atoms/cm$^3$.

4. The method of claim 1, wherein said etch-stop layer is silicon nitride and has a thickness of between about 100 and 300 Angstroms.

5. The method of claim 1, wherein said second insulating layer is silicon oxide and is deposited to a thickness of between about 2000 and 5000 Angstroms.

6. The method of claim 1, wherein said third insulating layer is silicon oxide and is deposited to a thickness of between about 1000 and 4000 Angstroms.

7. The method of claim 1, wherein said second polysilicon layer is conductively doped in-situ to a concentration of between about 1.0 E 19 and 1.0 E 21 atoms/cm$^3$, and is deposited to a thickness of between about 500 and 2000 Angstroms.

8. The method of claim 1, wherein said isotropic etching of said third and said second insulating layers is carried out in a hydrofluoric acid solution.

9. The method of claim 1, wherein said interelectrode dielectric layer is silicon oxide/silicon nitride/silicon oxide (ONO), and has a thickness of between about 40 and 100 Angstroms.

10. The method of claim 1, wherein said third polysilicon layer is doped with conductive impurities to a concentration of between about 1.0 E 19 and 1.0 E 21 atoms/cm$^3$, and has a thickness of between about 500 and 2000 Angstroms.

11. A method for fabricating dynamic random access memory (DRAM) devices having stacked capacitors comprising the steps of:

providing a semiconductor substrate having device areas with semiconductor devices;

forming a planar first insulating layer over said device areas on said substrate;

depositing a blanket silicon nitride etch-stop layer on said first insulating layer;

depositing a second insulating layer on said etch-stop layer;

selectively etching first openings for capacitor node contacts in said second insulating layer, said etch-stop layer, and said first insulating layer to said device areas;

depositing a conductively doped first polysilicon layer to fill said first openings, and etching back said first polysilicon layer to form polysilicon plugs that are recessed below the surface of said second insulating layer and above said etch-stop layer;

depositing a third insulating layer;

selectively etching second openings, over and wider than said first openings, in said third and said second insulating layers to the top surface of said etch-stop layer and to said polysilicon plugs;

depositing a conformal second polysilicon layer over and in said second openings and contacting said polysilicon plugs;

polishing back said second polysilicon layer to said third insulating layer to form bottom electrodes in said second openings;

isotropically etching said third and said second insulating layers selectively to said etch-stop layer to leave freestanding said bottom electrodes, while said polysilicon plugs that abut said etch-stop layer prevent said etching from eroding said first insulating layer when said second openings are misaligned to said first openings;

depositing an interelectrode dielectric layer on said bottom electrodes;

depositing and patterning a third polysilicon layer to form top electrodes and completing said stacked capacitors.

12. The method of claim 11, wherein said first insulating layer is silicon oxide, and has a thickness of between about 3000 and 6000 Angstroms after planarizing.

13. The method of claim 11, wherein said first polysilicon layer is doped with conductive impurities to a concentration of between about 1.0 E 17 and 1.0 E 21 atoms/cm$^3$.

14. The method of claim 11, wherein said etch-stop layer is silicon nitride and has a thickness of between about 100 and 300 Angstroms.

15. The method of claim 11, wherein said second insulating layer is silicon oxide and is deposited to a thickness of between about 2000 and 5000 Angstroms.

16. The method of claim 11, wherein said third insulating layer is silicon oxide and is deposited to a thickness of between about 1000 and 4000 Angstroms.

17. The method of claim 11, wherein said second polysilicon layer is conductively doped in-situ to a concentration of between about 1.0 E 19 and 1.0 E 21 atoms/cm$^3$, and is deposited to a thickness of between about 500 and 2000 Angstroms.

18. The method of claim 11, wherein said isotropic etching of said third and said second insulating layers is carried out in a hydrofluoric acid solution.

19. The method of claim 11, wherein said interelectrode dielectric layer is silicon oxide/silicon nitride/silicon oxide (ONO), and has a thickness of between about 40 and 100 Angstroms.

20. The method of claim 11, wherein said third polysilicon layer is doped with conductive impurities to a concentration of between about 1.0 E 19 and 1.0 E 21 atoms/cm$^3$, and has a thickness of between about 500 and 2000 Angstroms.

* * * * *